(12) United States Patent
Chong et al.

(10) Patent No.: US 7,119,579 B2
(45) Date of Patent: *Oct. 10, 2006

(54) SUPPLY VOLTAGE DETECTION CIRCUIT

(75) Inventors: Yan Chong, Stanford, CA (US); Chiakang Sung, Milpitas, CA (US); Bonnie Wang, Cupertino, CA (US); Khai Nguyen, San Jose, CA (US); Joseph Huang, San Jose, CA (US); Xiaobao Wang, Santa Clara, CA (US); Philip Pan, Freemont, CA (US); In Whan Kim, San Jose, CA (US); Gopi Rangan, Santa Clara, CA (US); Tzung-Chin Chang, San Jose, CA (US); Surgey Y. Shumarayev, San Leandro, CA (US); Thomas H. White, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 16 days.

This patent is subject to a terminal disclaimer.

(21) Appl. No.: 11/005,890

(22) Filed: Dec. 6, 2004

(65) Prior Publication Data
US 2005/0253626 A1    Nov. 17, 2005

Related U.S. Application Data

(63) Continuation of application No. 10/678,498, filed on Oct. 3, 2003, now Pat. No. 6,870,400, which is a continuation of application No. 09/887,686, filed on Aug. 22, 2001, now Pat. No. 6,630,844.

(60) Provisional application No. 60/227,069, filed on Aug. 22, 2000.

(51) Int. Cl.
  *H03K 19/0175*    (2006.01)
(52) U.S. Cl. .......................................... 326/82; 326/38
(58) Field of Classification Search ................. 326/38, 326/82–86, 89
  See application file for complete search history.

(56) References Cited

U.S. PATENT DOCUMENTS

| | | | | |
|---|---|---|---|---|
| 5,889,664 A | * | 3/1999 | Oh .............................. | 363/60 |
| 6,563,746 B1 | * | 5/2003 | Fujioka et al. ......... | 365/189.09 |
| 6,760,262 B1 | * | 7/2004 | Haeberli et al. ....... | 365/189.09 |

* cited by examiner

*Primary Examiner*—Don P. Le
(74) *Attorney, Agent, or Firm*—Morgan, Lewis & Bockius LLP

(57) ABSTRACT

A supply voltage detection circuit determines when the voltage for any one of the power supply signals received by an integrated circuit device is below its steady state level, as may occur during a hot socket condition when the device is inserted in or removed from a powered-on system. A first detection circuit determines when the first supply voltage level is below its steady state level, and a second detection circuit determines when the second supply voltage level is below its steady state level. A logic circuit provides a detected condition signal that disables current flow through an input/output terminal associated with the supply voltage detection circuit. The circuit is able to rapidly detect hot socket conditions for a wide range of power supply signal levels, including low supply signal levels, while limiting leakage current effects.

14 Claims, 4 Drawing Sheets

SUPPLY VOLTAGE DETECTION CIRCUIT

CROSS-REFERENCE TO RELATED APPLICATIONS

The present application is a continuation of Ser. No. 10/678,498, filed Oct. 3, 2003 now U.S. Pat. No. 6,870,400 which is a continuation of application Ser. No. 09/887,686 which was filed on Aug. 22, 2001 now U.S. Pat. No. 6,630,844 and claims the benefit and priority of U.S. Provisional Application No. 60/227,069 filed Aug. 22, 2000 and entitled "Power-On-Reset ("POR") and Hot-Socket Detection in Multi-Voltage Systems," the entire contents of which are incorporated herein by virtue of this reference.

FIELD OF INVENTION

The present invention relates to a circuit for detecting supply voltage conditions, especially hot socket events that occur when an integrated circuit device is inserted or removed from an electronic system while the system remains powered on. More particularly, the present invention relates to a supply voltage detection circuit suitable for detecting hot socket conditions in mixed supply voltage systems having a wide range of power supply voltage levels.

BACKGROUND OF THE INVENTION

Digital electronic systems are commonly implemented by combining and interconnecting several different integrated circuit (IC) devices such as processors, memory devices and programmable logic devices. Programmable logic devices (PLDs) are standardized ICs that are readily customizable to perform desired functions. The various IC devices typically communicate with one another by way of input/output (I/O) signals transmitted over a system bus. An UO power supply provides the necessary power for each device to drive I/O signals over the system bus. Many IC device, including several types of PLDs, also have a core power supply that provides the device with suitable power for processing signals.

System architectures may rely upon multiple supply voltage schemes, some of which are noisy and some of which are quiet. In particular, since bus controllers and other I/O circuitry are generally less sensitive and of lower speed than the core logic of an IC device, the UO power supply signal VCCN is often more noisy than a relatively quiet core power supply signal VCC (or VCCQ) for an IC device. By separating the power supplies in this fashion, the circuitry connected to the core power supply is isolated to a considerable extent from switching and other types of noise present on the noisier UO power supply. Increasingly, in newer IC devices, the core power supply voltage is lower than the I/O power supply voltage for that device.

Moreover, different IC devices within a digital system may operate at different supply voltage levels. As processing technology improves—for instance with the scaling down of CMOS (complementary metal-oxide semiconductor) devices—the power supply voltage levels required by IC devices are steadily lowering. However, devices made with newer processes still need to remain compatible with previous generations of IC devices. Furthermore, different types of IC devices may also require different power supply voltage levels. As a result, mixed voltage systems in which IC devices are powered by different supply voltages are common. In such systems, the I/O power supply must be capable of accommodating multiple voltage levels. Furthermore, the difference between the highest and lowest UO power supply signal levels within such systems is tending to increase, as is the difference between the highest I/O and lowest core power supply levels.

This growing variation in power supply levels within an electronic system presents significant difficulties in connection with the design of an efficient and effective "hot socket" detection circuit that can be used in IC devices having different power supply level requirements. Generally, a hot socket event may occur when an IC device is inserted in or removed from an electronic system while the system and its power supplies remain on. "Hot" insertions or removals may be necessary and/or desirable, for example, in high-end server computers that must have minimal down-time or in systems that employ high performance plug-and-play PLDs such as solid state disks and PCMCIA cards. In these and other instances, the insertion or removal of a device may cause a hot socket condition when the power supply pins of a device have not yet reached appropriate voltage levels or when a backplane power disruption occurs. For example, when an IC device is inserted within a system, a race condition occurs between the power supply pins of the inserted device and its I/O pins. If system signals reach the I/O pins before the necessary power reaches the device's power supply pins, the inputs and outputs may behave erratically and cause a disturbance in the system. These disturbances can adversely affect, and in some cases disable, the device as well as the rest of the system.

A supply voltage detection circuit may be used to detect and prevent the occurrence of a hot socket event and thereby improve system serviceability, reliability, and availability. When a hot socket condition is detected, the circuit activates related input/output buffer circuitry to disable an I/O pin associated with the circuit by placing the pin in a high impedance tri-state. The I/O pin remains tri-stated until appropriate supply voltage levels are reached at the IC device's power pins. Such a hot socket detection circuit is disclosed in U.S. Pat. No. 6,040,712, for example.

When the supply signals are steady and high, it is important that only small leakage currents be generated by a hot socket detection circuit to minimize the effect on regular operation of the device and system. For example, leakage currents may be generated into or out of the supply voltage pins of the device. However, in multiple-voltage systems, particularly as power supply levels decrease (e.g., to 1.5 V or lower), it may become increasingly difficult to keep leakage currents low. Furthermore, it is also essential that a hot socket detection circuit be capable of rapidly detecting and reacting to the occurrence of a hot socket condition to minimize any possible adverse effect on the device or overall system at the onset of such an event.

Consequently, there is a need for a more effective supply voltage detection circuit capable of providing low leakage currents and rapid hot socket condition detection in IC devices having a wide range in their I/O and core power supply levels. In addition, by using the same detection circuit design for different devices with a variety of power supply specifications, lower design costs and improved efficiency can be realized.

SUMMARY OF THE INVENTION

In accordance with the present invention, a supply voltage detection circuit operates to detect a supply voltage condition, in particular a hot socket condition, when the voltage at any one of an IC device's power supply signal pins, e.g., an I/O power supply signal VCCN or a core power supply signal VCC, is below its steady state or expected level. Hot socket conditions may occur when an IC device is inserted in or removed from an electronic system while the system remains powered on, i.e., while the I/O and core power supplies remain live. The detection circuit rapidly and effectively detects hot socket conditions for a wide range of power supply signal levels, including the low power supply signal levels that are increasingly common in newer IC devices. The detection circuit advantageously limits the size of leakage currents under steady state conditions, to minimize their effect on regular operation of the IC device and overall system.

In one aspect, the invention provides a detection circuit for an input/output terminal of an integrated circuit device. The input/output terminal may be a bidirectional terminal, a unidirectional input terminal, or a unidirectional output terminal. The circuit comprises a first voltage detection circuit having an input for receiving a first supply voltage signal and an output for providing a first detection signal. The first detection signal indicates when the voltage level of the first supply voltage signal is below a first steady state supply level. Similarly, a second voltage detection circuit has an input for receiving a second supply voltage signal and an output for providing a second detection signal that indicates when the voltage level of the second supply voltage signal is below a second steady state supply level. A logic circuit receives the first and second detection signals and provides at least one detected condition (e.g., hot socket condition) signal for disabling current flow through the input/output terminal when either the first supply voltage signal is below the first steady state supply level or the second supply voltage signal is below the second steady state supply level.

The detection circuit may further comprise a bias circuit for receiving the first supply voltage signal and a signal corresponding to the voltage at the input/output terminal. The bias circuit provides a bias power voltage signal substantially equal to the greater of the first supply voltage signal and the voltage at the input/output terminal. In one embodiment, the first voltage detection circuit is powered by the bias power voltage signal, and the second voltage detection circuit is powered by the first supply voltage signal, particularly where the first steady state supply level is greater than or equal to the second steady state supply level. The first supply voltage signal may be provided by an input/output power supply and the second supply voltage signal may be provided by a core power supply.

In one embodiment, each of the first and second voltage detection circuits includes a latch (such as a half latch) having an input and an output, with the output of the voltage detection circuit being at the input of the first latch. Each detection circuit further includes first and second transistors. The first transistor is coupled between the input of the voltage detection circuit and the output of the first latch, and the first transistor has a control terminal coupled to a power signal node for the voltage detection circuit. The second transistor is coupled between a reference supply voltage (e.g., VSS) and the input of the first latch, and the second transistor has a control terminal coupled to the input of the voltage detection circuit. To limit leakage currents, the first transistor may be a relatively weakly conducting transistor that has a lower conductivity than the second transistor.

The integrated circuit is conveniently fabricated using CMOS technology, and the first and second transistors may be NMOS transistors. The logic circuit for combining the first and second detection signals may comprise a NOR gate having those signals as inputs, and the logic circuit may also generate a pair of complementary detected condition signals that are used to tri-state the corresponding input/output terminal.

BRIEF DESCRIPTION OF THE DRAWINGS

The objects and advantages of the present invention will be better understood and more readily apparent when considered in conjunction with the following detailed description and accompanying drawings which illustrate, by way of example, preferred embodiments of the invention and in which.

DETAILED DESCRIPTION OF PREFERRED EMBODIMENTS

Figure 1:
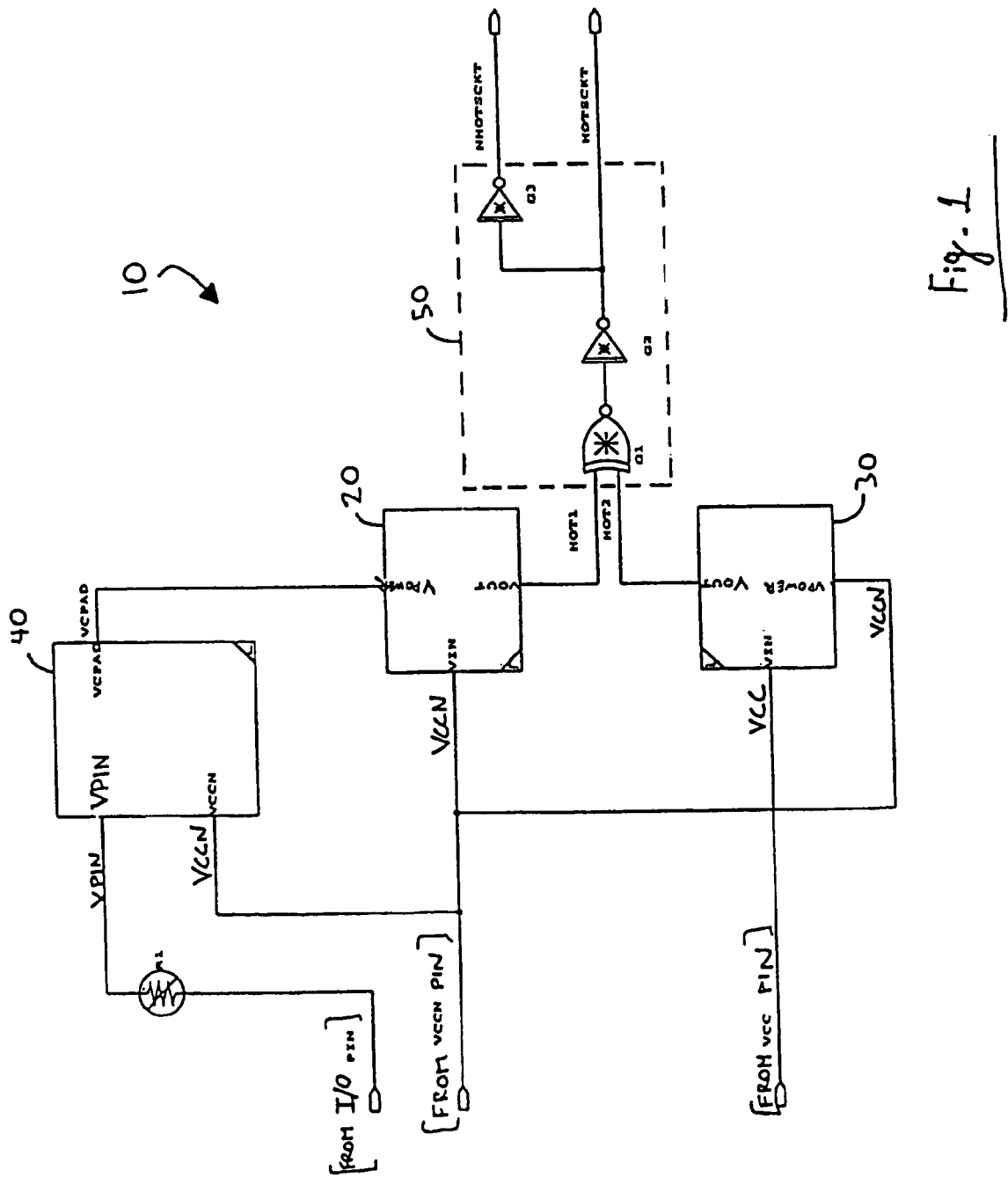
FIG. 1 is a circuit diagram of a supply voltage detection circuit according to one embodiment of the invention.

FIG. 1 is a circuit diagram of a supply voltage detection circuit 10 in accordance with an embodiment of the invention. Supply voltage detection circuit 10 is associated with an input/output (I/O) pin of an IC device, such as a PLD, in an electronic system (not shown). Typical applications of such systems include computer networking, data networking, telecommunications, instrumentation, and signal processing. However, the IC device may be included in any type of electronic system. Generally, the IC device has a number of I/O terminals, e.g., pins, for exchanging input and outputs signals with other devices in the system. The device may have other types of I/O terminals, such as bonding pads, solder balls, or bumps depending on its packaging. As used herein, an I/O terminal may refer to a terminal that is used exclusively as an input terminal, a terminal that is used exclusively as an output terminal, or a bidirectional terminal that can be configured to act either as an input or an output terminal at any desired time. The input and/or output buffer circuit for each I/O pin on the device may have an associated supply voltage detection circuit 10. In this case, each of the circuits 10 may form part of the overall integrated circuitry within the device.

The IC device is supplied with a first I/O power supply voltage signal VCCN at a first supply pin of the device and a second core power supply voltage signal VCC at a second supply pin. The I/O power supply signal VCCN may be noisier than the core supply signal VCC, where the latter is used to drive more noise-sensitive internal circuitry within the device. In addition, the supply signal levels may differ from one another for a given device, often with VCC being lower than VCCN. For example, in one specific embodiment, supply voltage detection circuit 10 may be used in all devices in which VCC equals 1.5 V and VCCN is within the range of 1.6 V to 3.3 V.

In accordance with the present invention, detection circuit 10 operates to detect a supply voltage condition, in particular a hot socket condition, when the voltage at one or both of the device's power supply signal pins for VCC and VCCN is below its steady or expected level. Such conditions may occur when an IC device is inserted in or removed from the electronic system while the system remains powered on, i.e., while the I/O and core power supplies remain live. Circuit 10 is advantageously able to efficiently and effectively detect such conditions for a wide range of VCC and VCCN signal levels, including for low power supply signal levels that are increasingly common in newer IC devices, such as PLDs.

Supply voltage detection circuit 10 may be implemented in a device fabricated using CMOS (complementary metal-oxide semiconductor) technology in which n-channel (NMOS) and p-channel (PMOS) metal-oxide semiconductor field-effect transistors are combined on a common substrate to form logic gates and/or memory cells. The body of a MOS transistor is effectively the channel of the transistor, and the body of an NMOS transistor in the device is generally connected to the most negative supply in the device (typically denoted VSS). In contrast, the body of a PMOS transistor is generally connected to the most positive voltage in the device, or in a specific part of the device. More particularly, for PMOS transistors in the input or output circuitry associated with a particular I/O pin, the most positive voltage is the larger of the supply voltage and the voltage at that I/O pin since either may affect diffusion in those transistors. In the embodiments described herein, the IC device is implemented on a p-type substrate that is connected to the most negative supply in the device (i.e., VSS). In this case, a PMOS transistor is typically formed in an n-well, i.e., a well of n-type material, provided within the p-type substrate. On the other hand, if the IC device is fabricated on an n-type substrate, the n-type substrate is typically connected to the most positive voltage in the device, and NMOS transistor is formed in a p-type doped well (or p-well) within the n-type substrate. It should be noted that, although the use of CMOS device technology is described and illustrated, supply voltage detection circuit 10 can be adapted for and implemented in IC devices based on other design technologies, such as NMOS or bipolar fabrication technologies.

Referring now to FIG. 1, supply voltage detection circuit 10 includes a pair of voltage detection circuits 20 and 30, a bias circuit 40, and a logic circuit 50. Circuit 10 receives as inputs the voltages at three pins of the IC device: the voltage VPIN at the I/O pin with which circuit 10 is associated, the voltage VCCN at a first power supply pin, and the voltage VCC at a second power supply pin. Bias circuit 40 has two inputs, the voltage VPIN at the associated I/O pin and the voltage VCCN. Generally, the output VCPAD of bias circuit 40 is substantially equal to the greater of VPIN and VCCN. For electrostatic discharge protection, a resistor R1 may be used to shield bias circuit 40 from the I/O pin, as shown.

As shown in FIG. 1, voltage detection circuit 20 receives the VCCN signal at its detection input VIN and the power signal VCPAD at its power input VPOWER. Voltage detection circuit 20 outputs a signal HOT1 that is high when the detection input signal VCCN is below its steady state or expected voltage level, as described below. Similarly, voltage detection circuit 30 receives the VCC signal at its detection input VIN and the VCCN signal at its power input VPOWER. Voltage detection circuit 30 outputs a signal HOT2 that is high when VCC is below its steady state or expected voltage level. Although the VPOWER input of circuit 30 could alternatively be connected to VCPAD, where VCC≦VCCN, the VPOWER connection illustrated in FIG. 1 is preferred since this reduces the leakage current at the I/O pin.

Referring still to FIG. 1, the HOT1 and HOT2 outputs are fed to logic circuit 50 and more specifically to the inputs of a NOR gate G1. The output of NOR gate G1, which is low when either or both of HOT1 and HOT2 are high, is then inverted at gate G2 to provide an active high detected (e.g., hot socket) condition signal HOTSCKT. As shown, the HOTSCKT signal may be further inverted at another gate G3 to provide a complementary detected condition signal NHOTSCKT. These detected condition signals may be used to tri-state an associated I/O pin of the IC device by placing them in a high although the NHOTSCKT signal is logically equivalent to the output of NOR gate G1, in the illustrated embodiment NHOTSCKT is taken from the output of inverter gate G3 so that it is buffered and better able to accommodate large loading. Although not shown, the source terminals of the PMOS transistors in gates G1, G2, and G3 are coupled to VCPAD, while the source terminals of NMOS terminals in those gates are connected to VSS.

Figure 2:
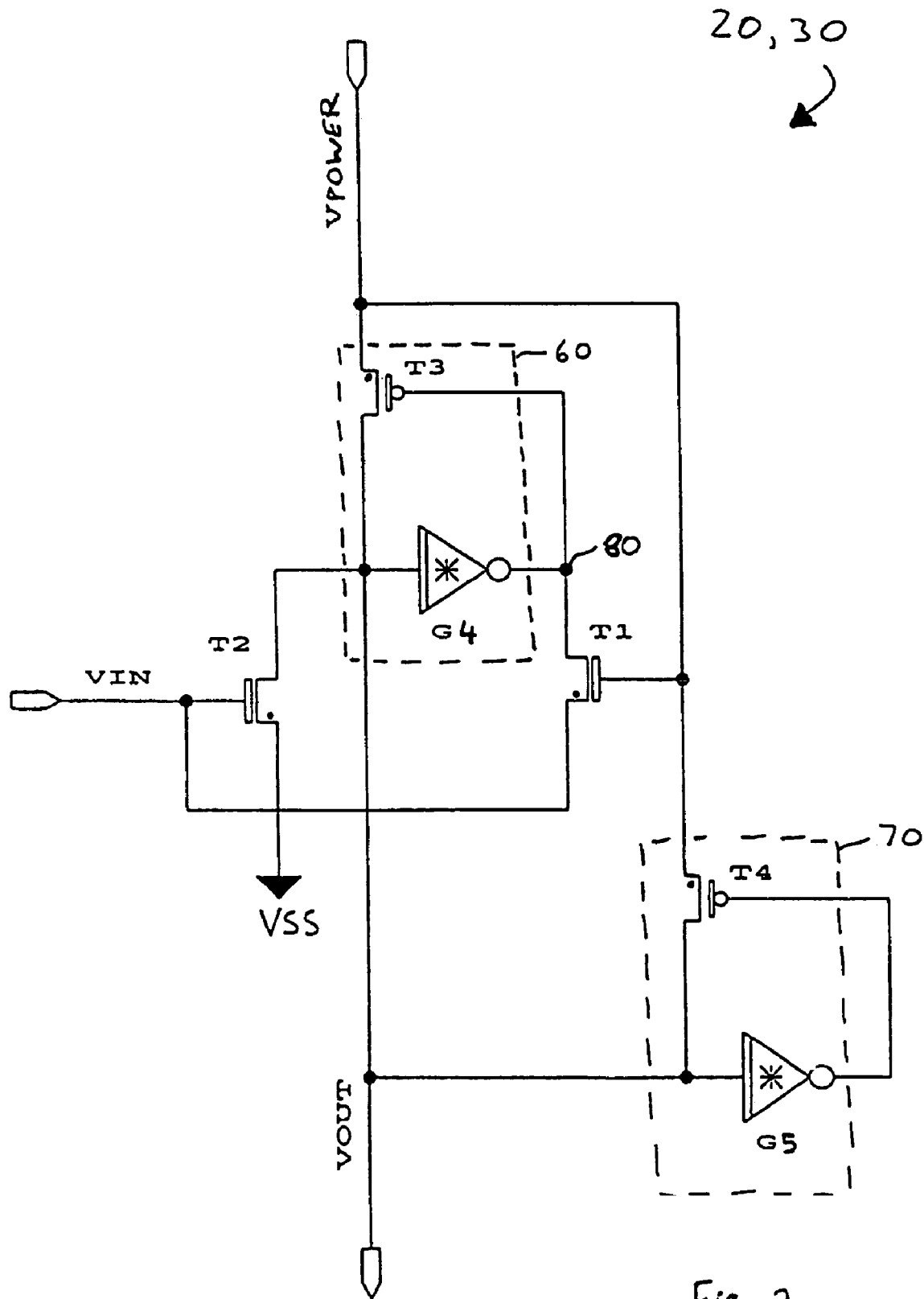
FIG. 2 is a circuit diagram showing an implementation of the voltage detection circuits in the supply voltage detection circuit of FIG. 1.

FIG. 2 is a circuit diagram showing an implementation of each of voltage detection circuits 20 and 30 in the supply voltage detection circuit of FIG. 1. As shown, the power supply signal (VCCN in circuit 20 and VCC in circuit 30) at the detection input VIN is provided to the source terminal of an NMOS transistor T1 and the gate terminal (i.e., control terminal) of another NMOS transistor T2. A PMOS transistor T3 and an inverter gate G4 form a first half-latch 60, and a PMOS transistor T4 and an inverter gate G5 form a second half-latch 70. The source terminal of transistor T2 is connected to the most negative supply reference VSS. The drain terminal of transistor T2 is connected to the input of inverter gate G4. Similarly, the drain of transistor T2 is also connected to the input of inverter gate G5. At a node 80, the drain terminal of transistor T1 is connected to the output of inverter G4 and to the gate terminal of transistor T3. The gate terminal of transistor T1, the source terminal of transistor T3, and the source terminal of transistor T4 are all connected to the power input VPOWER (VCPAD in circuit 20 and, preferably, VCCN in circuit 30). Although not shown, the source terminals of the PMOS transistors in gates G4 and G5 are coupled to the VPOWER input for each detection circuit, while the source terminals of NMOS terminals in gates G4 and G5 are connected to VSS. The output VOUT of the voltage detection circuit (HOT1 in circuit 20 and HOT2 in circuit 30) is taken at the drain terminal of transistor T2, as shown.

Half latches 60 and 70 are modified versions of conventional bistable latches formed from a pair of cross-coupled inverters with each inverter positively feeding back the other. In half latches 60 and 70, the second inverter is replaced by a transistor, T3 and T4 respectively, to facilitate the setting or latching of VOUT to a high level. Transistor T1 acts as a pull-down transistor for the voltage at node 80 and therefore initiates the setting of VOUT. However, to minimize leakage currents at the power supply pin corresponding to VIN, transistor T1 is preferably a relatively "weak" transistor of relatively small size (i.e., a small channel width to channel length ratio) and low conductivity. Transistor T1 may also have a relatively thick oxide layer between its gate and channel compared to the other transistors in the voltage detection circuit.

In the steady supply voltage state, the gate-to-source voltage of transistor T1 is VCPAD-VCCN in detection circuit 20 and VCCN- VCC in detection circuit 30. In many cases, the gate-to-source voltage of transistor T1 will be less than its turn-on threshold voltage, and so transistor T1 remains principally off except for a very small leakage current. Generally a MOSFET threshold voltage, which is positive for NMOS transistors and negative for PMOS transistors, typically has a magnitude between 0.5 and 3.0 V depending on the fabrication process, design, temperature, and other factors.

Furthermore, even when the gate-to-source voltage of transistor T1 exceeds its threshold voltage, the drain-to-source voltage of transistor T1 in the steady state in both detection circuits 20 and 30 is significantly smaller than its value during a hot socket condition. Therefore, the leakage current through transistor T1 is also relatively small even for steady state gate-to-source voltages that are larger than T1's threshold voltage. Therefore, if VCCN-VCC is larger than the threshold voltage of T1 in detection circuit 30, transistor T1 in that circuit will still conduct a relatively small current. For example, in one embodiment the threshold voltage of transistor T1 is approximately 1 V taking into consideration the body effect. In this case, if VCCN=3.6 V and VCC=1.5 V, the leakage current through transistor T1 may be only about 2 μA. Generally, there is a trade-off between faster detection times, which require a less weakly conducting transistor T1, and lower leakage currents, which require a more weakly conducting transistor T1.

During regular or steady state supply voltage conditions, the supply voltage input VIN is at its expected high voltage level. As a result, transistor T2 is on and the output VOUT is latched low. Consequently, the output of inverter gate G4 at node 80 is also latched high. Also during steady state supply operation, the source-to-gate voltage of PMOS transistors T3 and T4 is very small. The threshold voltage of transistors T3 and T4 may be selected to have a sufficiently high magnitude so that both T3 and T4 are substantially cut off under these conditions, keeping VOUT latched to its low level. Since transistor T1 has a relatively weak conductivity, it is unable to overcome the latching of node 80 and VOUT when VIN is at its steady state high value.

Upon occurrence of a hot socket (or other similar) condition, the supply voltage signal at VIN drops significantly below its steady state value. As a result, the gate-to-source voltage of transistor T1 becomes significantly greater than the threshold voltage for T1 and the drain-source voltage of T1 also becomes much larger than zero. Thus, transistor T1 enters its active saturation region, conducting a considerably larger current that, with the help of transistors T3 and T4 in half latches 60 and 70, rapidly pulls down the voltage at node 80. For example, for the exemplary design parameters given above (i.e., $Vth_{T1}$=1.0 V, VCCN=3.6 V, and VCC=1.5 V), the current conducted by transistor T1 in detection circuit 30 when VIN is very low, rises to about 8 μA. In addition, once the voltage at node 80 is sufficiently low to render the gate-to-source voltage of PMOS-transistor T3 more negative than its threshold voltage, transistor T3 turns on and VOUT is pulled high. When VOUT rises high enough to trigger the input of inverter gate G4, the voltage at node 80 is set low, further biasing transistor T3 in its saturation mode. In a similar manner, transistor T4 in half latch 70 also speeds up and aids in the pulling up of VOUT since, when the output of inverter gate G5 is set low by the rising VOUT signal, transistor T4 also turns on and conducts a significant amount of current from VPOWER to the VOUT node. As a result, VOUT quickly ramps up to a high level at the onset of a hot socket event in the power supply signal at VIN. In one embodiment, this occurs in about 2–5 nanoseconds.

While VIN remains low, i.e., below the threshold voltage of transistor T2, transistor T2 remains substantially cut off, conducts little current, and generally does not impede the setting and maintaining of a high VOUT voltage. However, as the hot socket condition subsides and VIN rises above transistor T2's threshold voltage, transistor T2 turns on and begins to compete with transistors T3 and T4 by pulling VOUT low. As VIN continues to rise, the current conducted by transistor T2 increases and VOUT is lowered: Since transistor T2 must conduct sufficient current to clear (or reset) half latch 70, transistor T2 generally has a much larger size and conductivity than transistor T1. Once VOUT is low enough to provide a logical low at the input of inverter gate G4, the voltage at node 80 is latched high, flipping half latches 60 and 70 and turning transistors T3 and T4 off.

Advantageously, transistor T1 and half latches 60 and 70 act to rapidly set the value of VOUT high in response to a hot socket condition, i.e., a low VIN level. Because half latch 60 sets quickly, large disturbances that may affect operation of the IC device or electronic system are not given any significant amount of time to develop.

Furthermore, as discussed above, supply voltage detection circuit 10 generates only relatively small leakage currents at the I/O, VCCN, and VCC pins when the supply voltage are at their regular steady state values. In particular, since transistor T1 is a relatively weakly conducting transistor and has a relatively small drain-to-source (and gate-to-source) voltage, the steady state leakage current that flows through T1 and appears at the supply voltage pin corresponding to the VIN signal is considerably smaller than during a hot socket condition. This is so, even where the difference between VCC and VCCN is large and/or one or both of VCC and VCCN has a relatively low steady state voltage level (e.g., 1.5–1.6 V). However, it will be appreciated that as the difference between the VCC and VCCN levels widens, leakage current effects generally become more pronounced. Furthermore, although the VPOWER input of voltage detection circuit 30 could also be connected to VCPAD like circuit 20, where VCC≦VCCN, the VPOWER connection illustrated in FIG. 1 better serves to minimize any leakage current at the I/O pin, since detection circuit 30 is isolated from the I/O pin. This is often desirable where the requirements to minimize leakage current effects on the I/O pins are more strict than on the power supply pins.

As indicated above, the body of a PMOS transistor in an IC device is generally connected to the most positive voltage in the relevant part of the device. Where the device is implemented on a p-type substrate, the PMOS transistor is formed in an n-well within the p-type substrate, and bias circuit 40 is typically referred to as a well bias circuit. Since the voltage VPIN at the I/O pin can potentially exceed the supply voltage biasing detection circuit 10, the PMOS transistors in the circuit are biased with the VCPAD signal which automatically switches between VPIN and VCCN (the most positive supply voltage in the illustrated embodiments). As will be appreciated, if VCC is larger than VCCN, the VCC supply may alternatively be provided as input to bias circuit 40.

Figure 3:
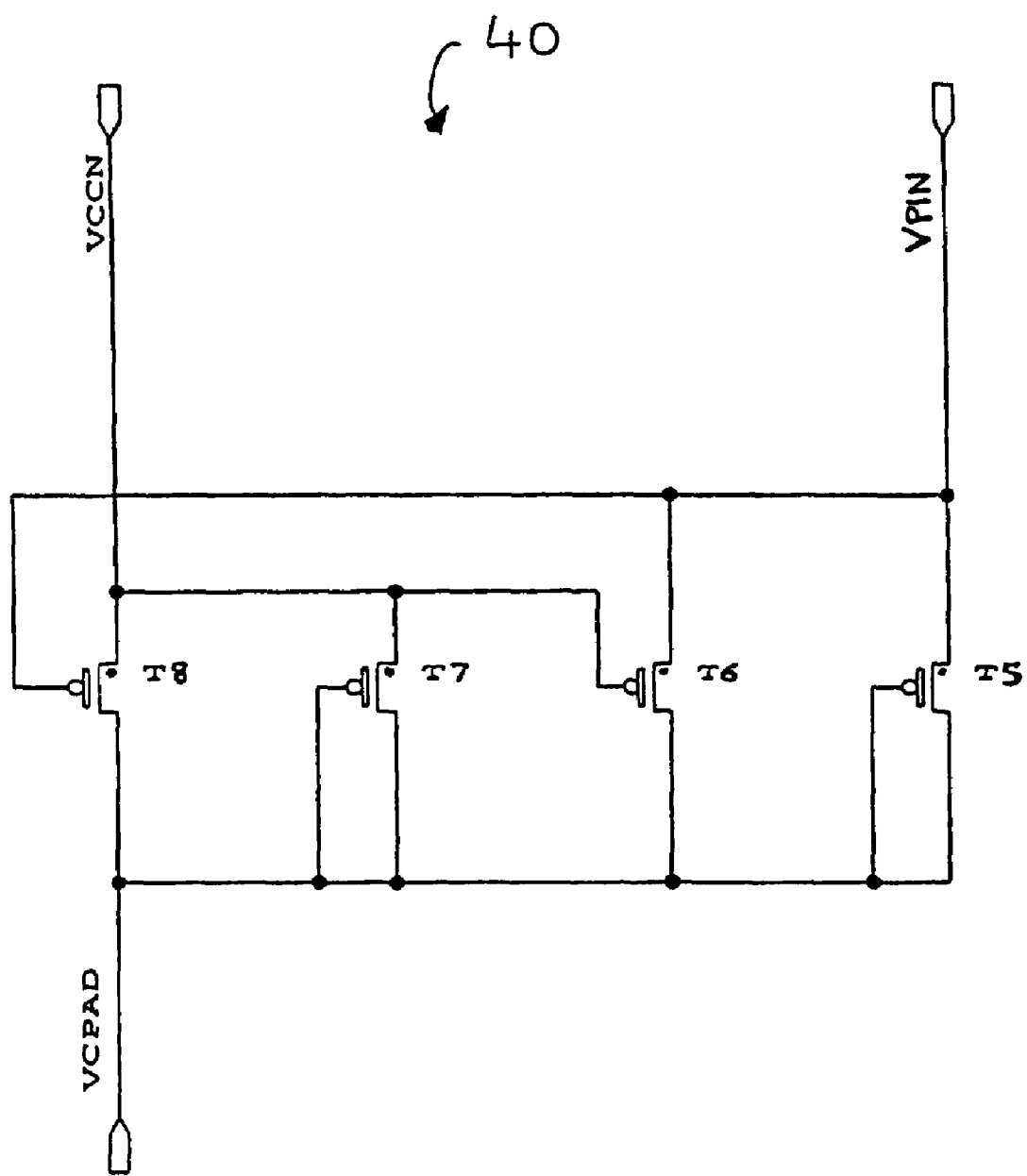
FIG. 3 is a circuit diagram showing an implementation of the bias circuit in the supply voltage detection circuit of FIG. 1.

FIG. 3 is a circuit diagram showing an implementation of bias circuit 40 in the supply voltage detection circuit of FIG. 1. In this embodiment, bias circuit 40 comprises four PMOS transistors T5, T6, T7, and T8. The drain terminals of all four transistors are connected to the output VCPAD. The source terminals of transistors T5 and T6 are connected to the input VPIN, while the source terminals of transistors T7 and T8 are connected to the input VCCN. The gate terminal of transistor T6 is connected to VCCN, and the gate terminal of transistor T8 is connected to VPIN. Transistors T5 and T7 are diode-connected since the gate terminals of those transistors are tied to their corresponding drain terminals, i.e., to VCPAD.

When VPIN is greater than VCCN by at least the threshold voltage of transistor T6, transistor T6 turns on and pulls VCPAD to the level of VPIN. Transistor T8 is cut off in this instance, and diode-connected transistors T5 and T7 are also off because their source-to-gate voltages are less than the corresponding threshold voltage levels. If VPIN is greater than VCCN by less than the threshold voltage of transistor T6, transistor T6 is off as are transistors T7 and T5. In this case, only diode-connected transistor T5 is on, and VCPAD is less than the level of VPIN by about the threshold voltage of transistor T5. Similarly, when VCCN is greater than VPIN by at least the threshold voltage of transistor T8, transistors T5, T6, and T7 are cut off, and transistor T8 turns on and pulls VCPAD to the level of VCCN. If VCCN is greater than VPIN by less than the threshold voltage of transistor T8, transistor T8 is off and diode-connect transistor T7 turns on, bringing VCPAD the level of VCCN by about the threshold voltage of transistor T7. When VCCN and VPIN are equal, both diode-connected transistors T5 and T7 conduct and VCPAD is again about one threshold voltage below VPIN=VCCN. The threshold voltages of transistors T5, T6, T7, and T8 are relatively small so that VCPAD can be provided at a level close to that of the greater of VPIN and VCCN.

As described above, the VCPAD signal is provided as the power input VPOWER to voltage detection circuit 20 (optionally, it may also provide the power input to voltage detection circuit 30). The bodies of all PMOS transistors in supply voltage detection circuit 10, i.e., the PMOS transistors in gates G1 through G5 and PMOS transistors T3 through T8, are also connected to VCPAD. The body of the NMOS transistors in circuit 10, i.e., the NMOS transistors in gates G1 through G5 and NMOS transistors T1 T2, may be connected to the most negative supply reference VSS.

As noted, in one embodiment, the above described supply voltage detection circuit 10 is particularly suitable for devices having a core supply voltage VCC of about 1.5 V and an I/O supply voltage VCCN within the range of about 1.6 V to 3.3 V. Furthermore, the exact same supply voltage detection circuit 10 can conveniently be used for all I/O pins in all IC devices manufactured according to the same fabrication process. Optionally, on a given IC device, the supply voltage detection circuits for each I/O pin may share the same voltage detection circuit 30 where the power input to that circuit is VCCN (and not VCPAD). For different fabrication processes, the size and conductivity of transistor T1, in particular, may be adjusted to best conform with the desired variation in VCC and VCCN as well as the leakage current specifications for the device.

Figure 4:
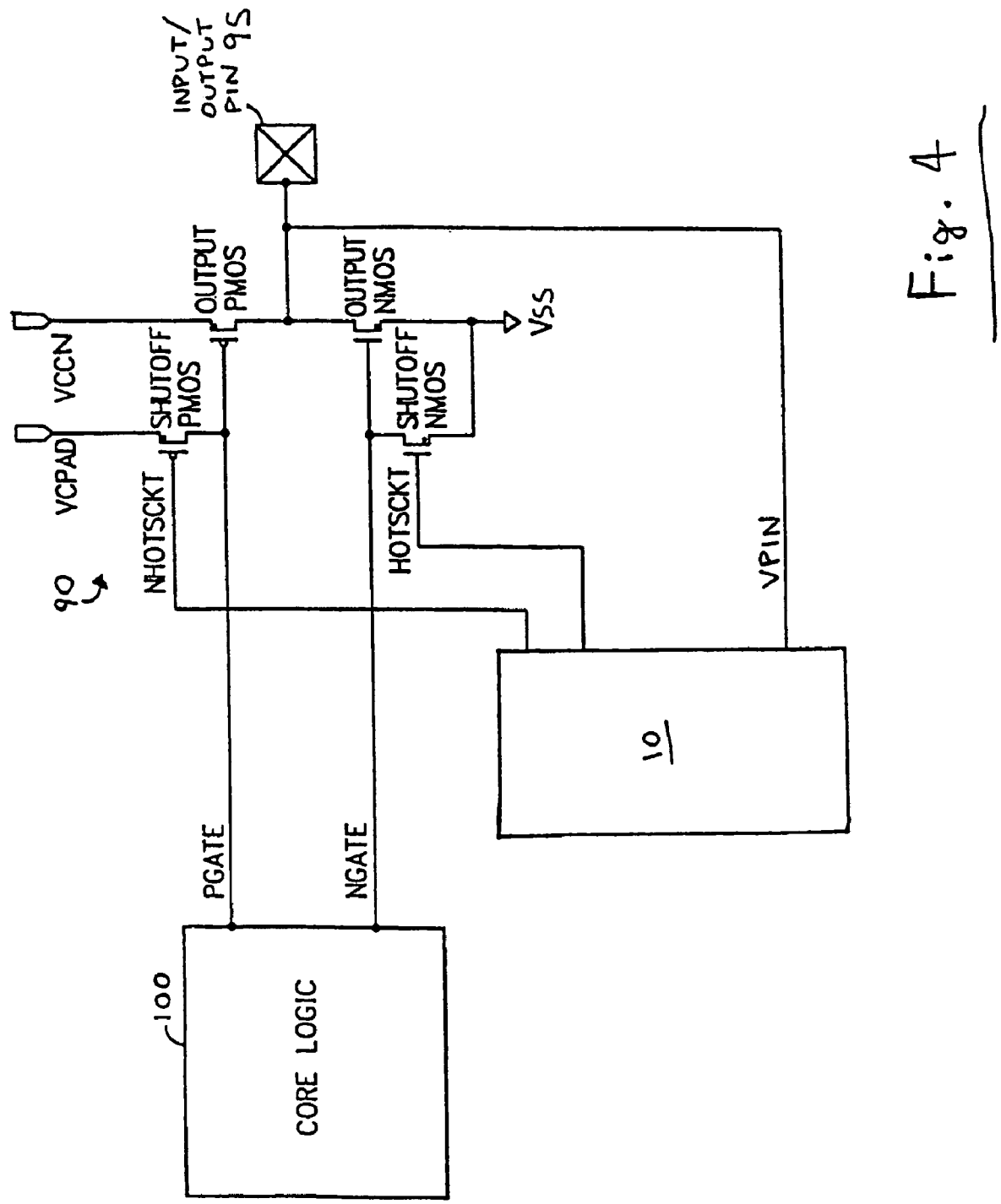
FIG. 4 is a circuit diagram showing an output buffer for use in association with the supply voltage detection circuit of FIG. 1.

FIG. 4 is a circuit diagram illustrating an output buffer circuit 90 suitable for disabling an I/O pin 95 of a CMOS IC device when a hot socket (or other similar) condition is detected by the supply voltage detection circuit 10 associated with pin 95. As will be appreciated, an input buffer circuit (not shown) with similar functionality can also be readily provided. The I/O pins are disabled by the outputs of the supply voltage detection circuit by placing them in a high impedance tri-state in which current is predominantly blocked from flowing into or out of the I/O terminals on the device. Referring to FIG. 4, output buffer circuit 90 receives drive signals PGATE and NGATE from core logic 100 within the IC device. Core logic 100 may be, for example, a logic array in a PLD. The PGATE signal is connected to the gate of a pull-up transistor OUTPUT PMOS, while the NGATE signal is connected to the gate of a pull-down transistor OUTPUT NMOS. The source of the OUTPUT PMOS transistor is connected to VCCN, the source of the OUTPUT NMOS transistor is connected to VSS, and the drains of both transistors are connected together at the I/O pin 95. The pull-up and pull-down CMOS output transistors thereby control the voltage level of the digital signal provided on I/O pin 95. As described above, the voltage VPIN at output pin 95 is also fed back to circuit 10 where it is provided to bias circuit 40.

The complementary signals HOTSCKT and NHOTSCKT from supply voltage detection circuit 10 are provided to the gate terminals of a SHUTOFF NMOS transistor and a SHUTOFF PMOS transistor respectively. The SHUTOFF PMOS transistor's source terminal is connected to VCPAD and its drain terminal to PGATE. The source and drain terminals of the SHUTOFF NMOS transistor are connected to VSS and to NGATE respectively. When a hot socket condition occurs, HOTSCKT goes high and NHOTSCKT goes low. In response, transistor SHUTOFF PMOS turns on, pulling up the gate of the OUTPUT PMOS transistor and thereby shutting it off. Similarly, when HOTSCKT goes high it turns on transistor SHUTOFF NMOS, pulling down the gate of the OUTPUT NMOS pull-down transistor and causing it to shut-off. In this manner, the HOTSCKT and NHOTSCKT signals override the PGATE and NGATE signals from core logic 100 and place output pin 95 in a high impedance tri-state. In the tri-state, no substantial current flows into or out of the I/O pins of the IC device, and the IC device is unable to propagate and/or receive any disturbances over the system bus.

While the invention has been described in conjunction with specific embodiments, it is evident that numerous alternatives, modifications, and variations will be apparent to those skilled in the art in light of the foregoing description. For example, as already indicated, although the use of CMOS device technology has been described above, supply voltage detection circuit 10 can be readily adapted for and implemented in IC devices based on other design technologies, including NMOS and bipolar fabrication technologies.

What is claimed is:

1. A voltage detection circuit comprising:
   a first latch having an input and an output, an output of said voltage detection circuit being at the input of the first latch;
   a first transistor coupled between an input of said voltage detection circuit and the output of the first latch, the first transistor having a control terminal coupled to a node for a power signal for said voltage detection circuit; and
   a second transistor coupled between a reference supply voltage and the input of the first latch, the second transistor having a control terminal coupled to the input of said voltage detection circuit.

2. The detection circuit of claim 1 wherein the first transistor has a lower conductivity than the second transistor.

3. The detection circuit of claim 1 wherein
   the first transistor is an NMOS transistor having a source terminal coupled to the input of said voltage detection circuit, a drain terminal coupled to the output of the first latch, and a gate terminal coupled to the power signal node for said voltage detection circuit; and
   the second transistor is an NMOS transistor having a source terminal coupled to the reference supply voltage, a drain terminal coupled to the input of the first latch, and a gate terminal coupled to the input of said voltage detection circuit.

4. The detection circuit of claim 1 wherein the first latch is a half latch comprising:

an inverter having an input and an output, the input of the inverter being the input of the first latch and the output of the inverter being the output of the first latch; and a third transistor coupled between the input of the first latch and the power signal node for said voltage detection circuit, the third transistor having a control terminal coupled to the output of the first latch.

5. The detection circuit of claim 4 further comprising detection circuits includes a second half latch comprising:

a second inverter having an input and an output, the input of the second inverter being coupled to the input of the first latch;

a fourth transistor coupled between the input of the first latch and the power signal node for said voltage detection circuit, the third transistor having a control terminal coupled to the output of the second inverter.

6. The detection circuit of claim 5 wherein the third transistor is a PMOS transistor having a source terminal coupled to the power signal node for said voltage detection circuit, a drain terminal coupled to the input of the first latch, and a gate terminal coupled to the output of the first latch; and the fourth transistor is a PMOS transistor having a source terminal coupled to the power signal node for said voltage detection circuit, a drain terminal coupled to the input of the first latch, and a gate terminal coupled to the output of the second inverter.

7. A supply voltage detection circuit for an input/output terminal of an integrated circuit device, comprising:

a first voltage detection circuit having an input for receiving a first supply voltage signal and an output for providing a first detection signal that indicates when the voltage level of the first supply voltage signal is below a first steady state supply level;

a second voltage detection circuit having an input for receiving a second supply voltage signal and an output for providing a second detection signal that indicates when the voltage level of the second supply voltage signal is below a second steady state supply level; and a logic circuit for receiving the first and second detection signals and providing at least one detected condition signal for disabling current flow through the input/output terminal when either the first supply voltage signal is below the first steady state supply level or the second supply voltage signal is below the second steady state supply level, wherein the first steady state supply level is greater than or equal to the second steady state supply level, the power signal for the first voltage detection circuit is the greater of the first supply voltage signal and a signal corresponding to the voltage at the input/output terminal, and the power signal for the second voltage detection circuit is the first supply voltage signal.

8. The detection circuit of claim 7 wherein the first steady state supply level is greater than or equal to the second steady state supply level, and the power signal for each of the first and second voltage detection circuits is the greater of the first supply voltage signal and a signal corresponding to the voltage at the input/output terminal.

9. The detection circuit of claim 7 wherein each of the first and second voltage detection circuits comprises:

a first latch having an input and an output, the output of said voltage detection circuit being at the input of the first latch;

a first transistor coupled between the input of said voltage detection circuit and the output of the first latch, the first transistor having a control terminal coupled to a node for a power signal for said voltage detection circuit; and a second transistor coupled between a reference supply voltage and the input of the first latch, the second transistor having a control terminal coupled to the input of said voltage detection circuit.

10. The detection circuit of claim 9 wherein the first transistor has a lower conductivity than the second transistor.

11. The detection circuit of claim 9 wherein the first transistor is an NMOS transistor having a source terminal coupled to the input of said voltage detection circuit, a drain terminal coupled to the output of the first latch, and a gate terminal coupled to the power signal node for said voltage detection circuit; and the second transistor is an NMOS transistor having a source terminal coupled to the reference supply voltage, a drain terminal coupled to the input of the first latch, and a gate terminal coupled to the input of said voltage detection circuit.

12. The detection circuit of claim 9 wherein the first latch is a half latch comprising:

an inverter having an input and an output, the input of the inverter being the input of the first latch and the output of the inverter being the output of the first latch; and a third transistor coupled between the input of the first latch and the power signal node for said voltage detection circuit, the third transistor having a control terminal coupled to the output of the first latch.

13. The detection circuit of claim 12 wherein each of the first and second voltage detection circuits includes a second half latch comprising:

a second inverter having an input and an output, the input of the second inverter being coupled to the input of the first latch;

a fourth transistor coupled between the input of the first latch and the power signal node for said voltage detection circuit, the third transistor having a control terminal coupled to the output of the second inverter.

14. The detection circuit of claim 13 wherein the third transistor is a PMOS transistor having a source terminal coupled to the power signal node for said voltage detection circuit, a drain terminal coupled to the input of the first latch, and a gate terminal coupled to the output of the first latch; and the fourth transistor is a PMOS transistor having a source terminal coupled to the power signal node for said voltage detection circuit, a drain terminal coupled to the input of the first latch, and a gate terminal coupled to the output of the second inverter.

* * * * *